United States Patent
Suzuki et al.

(10) Patent No.: US 9,366,728 B2
(45) Date of Patent: Jun. 14, 2016

(54) DEGRADATION MEASUREMENT DEVICE, SECONDARY BATTERY PACK, DEGRADATION MEASUREMENT METHOD, AND PROGRAM

(75) Inventors: Shin Suzuki, Kanagawa (JP); Yoichiro Tashiro, Tokyo (JP)

(73) Assignees: NEC ENERGY DEVICES, LTD., Kanagawa (JP); NEC CORPORATION, Tokyo (JP)

(*) Notice: Subject to any disclaimer, the term of this patent is extended or adjusted under 35 U.S.C. 154(b) by 456 days.

(21) Appl. No.: 14/002,851

(22) PCT Filed: Dec. 28, 2011

(86) PCT No.: PCT/JP2011/080375
§ 371 (c)(1),
(2), (4) Date: Sep. 17, 2013

(87) PCT Pub. No.: WO2012/132160
PCT Pub. Date: Oct. 4, 2012

(65) Prior Publication Data
US 2014/0009164 A1 Jan. 9, 2014

(30) Foreign Application Priority Data
Mar. 25, 2011 (JP) .................. 2011-068213

(51) Int. Cl.
*G01N 27/416* (2006.01)
*G01R 31/36* (2006.01)

(52) U.S. Cl.
CPC ........ *G01R 31/3606* (2013.01); *G01R 31/3624* (2013.01); *G01R 31/3679* (2013.01); *G01R 31/3658* (2013.01)

(58) Field of Classification Search
USPC ........................................ 324/430
See application file for complete search history.

(56) References Cited

U.S. PATENT DOCUMENTS 7,405,571 B1* 7/2008 Liu ................. G01R 31/362
324/430
2008/0180062 A1 7/2008 Okumura
(Continued)

FOREIGN PATENT DOCUMENTS

CN 101025437 A 8/2007
GB 2448412 A 10/2008
(Continued)

OTHER PUBLICATIONS

Communication dated Nov. 4, 2014 from the State Intellectual Property Office of the People's Republic of China in counterpart application No. 201180069574.9.
(Continued)

*Primary Examiner* — Robert Grant
(74) *Attorney, Agent, or Firm* — Sughrue Mion, PLLC (57) ABSTRACT

A battery sensing section measures a voltage across a secondary battery. A current sensing section measures a current flowing through the secondary battery. A control section holds the value of an external impedance present in a discharge path outside the secondary battery, discharges the secondary battery from a first time to a second time at which an integrated discharge capacity based on a measured discharge current becomes equal to a predetermined discharge capacity reference value, calculates the internal impedance present in the secondary battery at the second time based on the measured voltage, calculates the second open voltage at the second time by multiplying the sum of the external impedance and the internal impedance by the measured discharge current, and calculates the recovered capacity of the secondary battery based on the first open voltage at the first time, the second open voltage and the discharge capacity reference value.

13 Claims, 6 Drawing Sheets

(56) References Cited

U.S. PATENT DOCUMENTS

2008/0303528 A1* 12/2008 Kim .................. G01R 31/3627
324/430
2009/0091299 A1 4/2009 Lin et al.
2009/0256528 A1* 10/2009 Greening .......... H01M 10/0525
320/162

FOREIGN PATENT DOCUMENTS

| | | |
|---|---|---|
| JP | 2002-165371 A | 6/2002 |
| JP | 2003-224901 A | 8/2003 |
| JP | 2005-083970 A | 3/2005 |
| WO | 2009158226 A2 | 12/2009 |

OTHER PUBLICATIONS

Communication dated Aug. 11, 2014 from The European Patent Office in counterpart European Patent Application No. 11862624.1.
Coleman M. et al., "State of Health Determination: Two Pulse Load Test for a VRLA Battery", Power Electronics Specialists Conference, Jun. 18, 2006, pp. 1-6.

* cited by examiner

DEGRADATION MEASUREMENT DEVICE, SECONDARY BATTERY PACK, DEGRADATION MEASUREMENT METHOD, AND PROGRAM

CROSS REFERENCE TO RELATED APPLICATIONS

This application is a National Stage of International Application No. PCT/JP2011/080375 filed Dec. 28, 2011, claiming priority based on Japanese Patent Application No. 2011-068213 filed Mar. 25, 2011, the contents of all of which are incorporated herein by reference in their entirety.

BACKGROUND OF INVENTION

1. Technical Field

The present invention relates to measurement of degradation of a secondary battery.

2. Background Art

In recent years, with the increase in significance of environmental problems, the use of lithium-ion secondary batteries that are used in electric vehicles (EV), hybrid electric vehicles (HEV) and the like to electricity storage systems for storing surplus power produced by photovoltaic (PV) power generation has been studied. Lithium-ion secondary batteries are also attracting attention because they are effective in solving an environmental problem with secondary batteries such as lead-acid batteries.

Secondary batteries, however, have limited lifetimes and degrade by being repeatedly charged and discharged, and their battery capacity recovery to full charge (recovered capacity) is reduced. As a method of measuring the degree of degradation of a secondary battery, a method is known in which a battery is fully charged and then discharged; the current and the voltage are measured during this process; and the battery capacity is calculated by an integrating method. However, it is rarely the case that a secondary battery used in an electricity storage system is fully discharged. Therefore, it is not easy to measure the battery capacity by this method.

Patent Literature 1 discloses a method of calculating total real capacity (recovered capacity) of a secondary battery by utilizing the fact that the capacity of the secondary battery relative to the full-charge capacity is uniquely determined from the open voltage. In the method disclosed in Patent Literature 1, the discharge current is integrated in a load-connected state and the open voltage is thereafter measured in an unloaded state. A relative capacity value is obtained from the open voltage, and a total real capacity (recovered capacity) of the secondary battery is calculated from the integrated discharge current and the relative capacity value obtained from the open voltage.

RELATED ART LITERATURE

Patent Literature

Patent Literature 1: JP2003-224901A

DISCLOSURE OF INVENTION

The method disclosed in Patent Literature 1 is a method of measuring the open voltage after stopping discharge, which does not enable measurement of the open voltage in a state where discharge is being continued. However, it is difficult to arbitrarily stop discharge of a secondary battery being discharged in a system for the purpose of measuring the degree of battery degradation.

In the method disclosed in Patent Literature 1, assuming that the open voltage converges on a certain value in a short time after stopping discharge, the open voltage is measured after a lapse of a certain time period from the time at which discharge is stopped. However, the battery operates in a specific rebound manner. In some cases, there is a possibility of failure to correctly measure the open voltage unless the voltage is measured after a lapse of several hours after the time at which discharge is stopped. If the measured open voltage is not correct, the recovered capacity that is measured based on it and, hence, the degree of degradation also will not be correct.

An object of the present invention is to provide a technique for easily measuring with high accuracy the degree of degradation of a secondary battery.

SUMMARY OF INVENTION

To achieve the above-described object, a degradation measurement device according to the present invention includes:

a battery sensing section that measures a voltage across a secondary battery;

a current sensing section that measures a current flowing through the secondary battery; and a control section that holds in advance the value of an external impedance present in a discharge path outside the secondary battery, discharges the secondary battery from a first measurement time to a second measurement time at which an integrated discharge capacity based on a discharge current measured by the current sensing section becomes equal to a predetermined discharge capacity reference value, calculates an internal impedance present in the secondary battery at the second measurement time based on the voltage measured by the battery sensing section, calculates a second open voltage at the second measurement time by multiplying the sum of the external impedance and the internal impedance by the discharge current measured by the current sensing section, and calculates recovered capacity of the secondary battery based on a first open voltage at the first measurement time, the second open voltage and the discharge capacity reference value.

To achieve the above-described object, a secondary battery pack according to the present invention includes:

a secondary battery capable of being charged and discharged;

a battery sensing section that measures a voltage across the secondary battery;

a current sensing section that measures a current flowing through the secondary battery; and a control section that holds in advance the value of an external impedance present in a discharge path outside the secondary battery, discharges the secondary battery from a first measurement time to a second measurement time at which an integrated discharge capacity based on a discharge current measured by the current sensing section becomes equal to a predetermined discharge capacity reference value, calculates an internal impedance present in the secondary battery at the second measurement time based on the voltage measured by the battery sensing section, calculates a second open voltage at the second measurement time by multiplying the sum of the external impedance and the internal impedance by the discharge current measured by the current sensing section, and calculates recovered capacity of the secondary battery based on a first open voltage at the first measurement time, the second open voltage and the discharge capacity reference value.

To achieve the above-described object, a degradation measurement method according to the present invention includes:

holding in advance the value of an external impedance present in a discharge path outside a secondary battery;

discharging the secondary battery from a first measurement time to a second measurement time at which an integrated discharge capacity based on a measured discharge current becomes equal to a predetermined discharge capacity reference value;

calculating an internal impedance present in the secondary battery at the second measurement time based on a voltage measured by the battery sensing section, and calculating a second open voltage at the second measurement time by multiplying the sum of the external impedance and the internal impedance by the measured discharge current; and calculating a recovered capacity of the secondary battery based on a first open voltage at the first measurement time, the second open voltage and the discharge capacity reference value.

To achieve the above-described object, a program according to the present invention for causing a computer to execute the steps of:

holding in advance the value of an external impedance present in a discharge path outside a secondary battery;

discharging the secondary battery from a first measurement time to a second measurement time at which an integrated discharge capacity based on a measured discharge current becomes equal to a predetermined discharge capacity reference value;

calculating an internal impedance present in the secondary battery at the second measurement time based on a voltage measured by the battery sensing section, and calculating a second open voltage at the second measurement time by multiplying the sum of the external impedance and the internal impedance by the measured discharge current; and calculating a recovered capacity of the secondary battery based on a first open voltage at the first measurement time, the second open voltage and the discharge capacity reference value.

According to the preset invention, measurement of degradation of a secondary battery can be easily performed with high accuracy.

EXEMPLARY EMBODIMENT

Exemplary embodiments will be described with reference to the drawings.

First Exemplary Embodiment

Figure 1:
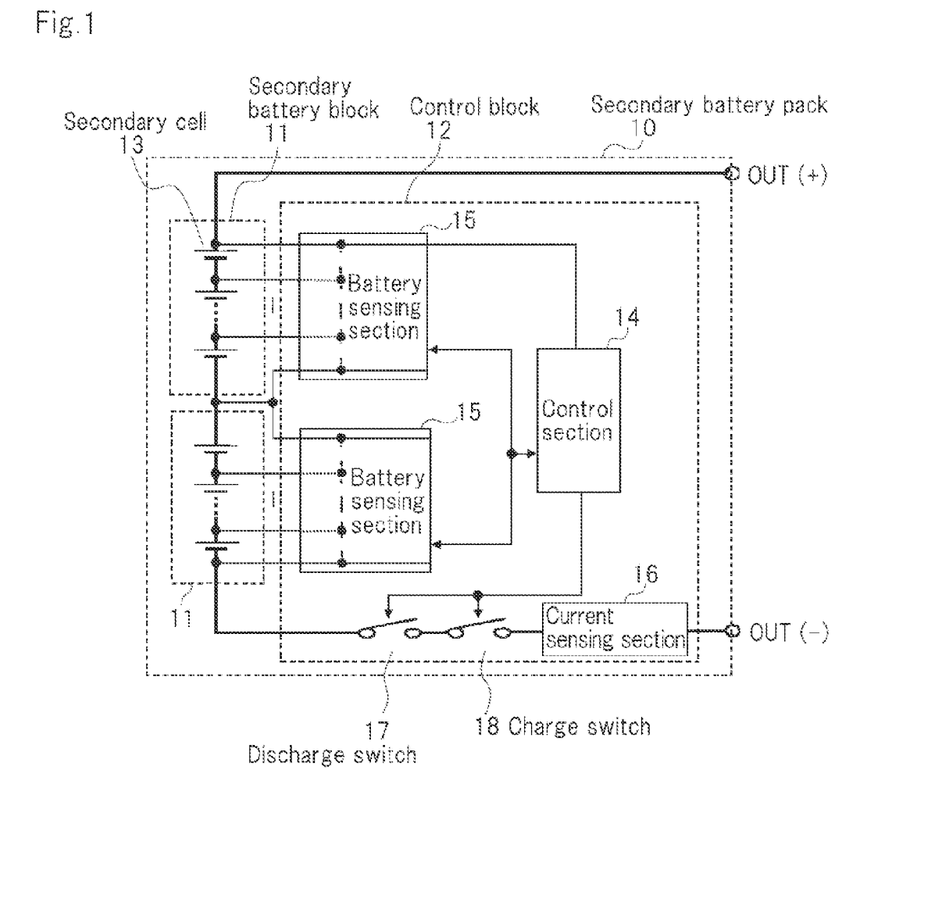
FIG. 1 is a block diagram showing the configuration of a secondary battery pack 10 according to a first exemplary embodiment.

FIG. 1 is a block diagram showing the configuration of a secondary battery pack according to a first exemplary embodiment. Referring to FIG. 1, secondary battery pack 10 includes two secondary battery blocks 11 and control block 12. Each secondary battery block 11 is formed of a plurality of secondary cells 13 connected in series. Control block 12 includes control section 14, battery sensing sections 15, current sensing section 16, discharge switch 17 and charge switch 18. Control block 12 is an example of the degradation measurement device.

A plurality of secondary battery packs 10 may be disposed in parallel with each other. In such a case, a host system (not shown) that controls the plurality of secondary battery packs 10 and each of the control sections in secondary battery packs 10 may communicate with each other, and each control section 14 may operate at a command from the host system.

Two battery sensing sections 15 sense voltages across secondary cells 13 in two secondary battery blocks 11.

Discharge switch 17 is a switch for turning on/off a discharge path under the control of control section 14. Charge switch 18 is a switch for turning on/off a charge path under the control of control section 14.

Current sensing section 16 measures a discharge current or a charge current in secondary battery pack 10.

Control section 14 controls battery sensing sections 15, current sensing section 16, discharge switch 17 and charge switch 18. Control section 14 turns on discharge switch 17 at the time of discharging secondary cells 13, and turns on charge switch 18 at the time of charging secondary cells 13.

Secondary cell 13 in an unused state, not degraded, has a predetermined charge capacity (hereinafter referred to as "initial capacity"). Secondary cell 13 degrades gradually by being repeatedly charged and discharged. With the progress of degradation, secondary cell 13 becomes unable to be recovered to the initial capacity even when fully charged; only a recovery to a certain capacity (hereinafter referred to as "recovered capacity") can be achieved. The proportion of the recovered capacity to the initial capacity is referred to as the degree of degradation.

Operations relating to degradation measurement will be described below.

Control section 14 measures one or both of a recovered capacity and the degree of degradation for degradation measurement. It is assumed here that control section 14 measures both of them.

In the present exemplary embodiment, there is a need to calculate the impedance in the discharge path. In the impedance calculation in the present exemplary embodiment, the impedance of the discharge path is considered by being separated into an internal impedance present in secondary cells 13 and an external impedance present in the discharge path outside secondary cells 13. The internal impedance is changed by discharge. On the other hand, the external impedance can change with time and change depending on the environment but, unlike the internal impedance, is not changed by discharge. In the present exemplary embodiment, therefore, a system is assumed in which the external impedance is constant or can be regarded as constant during degradation measurement.

Control section 14 holds the value of the external impedance in advance. This external impedance is calculated by control section 14 when secondary cells 13 are changed from an open state to a discharged state, based on the voltage measured in the open state by battery sensing section 15 and the voltage measured in the discharged state by battery sensing section 15. Details of a method of measuring and calculating the external impedance will be described later. Control section 14 may update the held external impedance each time secondary cells 13 are changed from the open state to the discharged state.

Control section 14 discharges secondary cells 13 from a first measurement time to a second measurement time at which an integrated discharge capacity based on the discharge current measured by current sensing section 16 becomes equal to a predetermined discharge capacity reference value.

Subsequently, control section 14 calculates a first open voltage at the first measurement time and a second open voltage at the second measurement time. For this calculation, control section 14 first calculates the internal impedance at the first measurement time or the second measurement time based on the voltage measured by battery sensing section 15. Details of a method of calculating the internal impedance will be described later. Next, control section 14 calculates the open voltage by multiplying the sum of the external impedance and the internal impedance by the discharge current measured by current sensing section 16.

Subsequently, control section 14 calculates a recovered capacity of secondary cells 13 based on the first open voltage, the second open voltage and the discharge capacity reference value. More specifically, control section 14 first obtains as a calculated discharge rate value the difference between the proportion of the remaining capacity of secondary cells 13 obtained from the first open voltage to the recovered capacity and the proportion of the remaining capacity of secondary cells 13 obtained from the second open voltage to the recovered capacity. Control section 14 then calculates as the degree of degradation the proportion of the discharge rate reference value to the calculated discharge rate value, which is the proportion of the discharge capacity reference value to the initial capacity of secondary cells 13.

Further, control section 14 calculates the recovered capacity by multiplying the initial capacity by the calculated degree of degradation.

Figure 2:
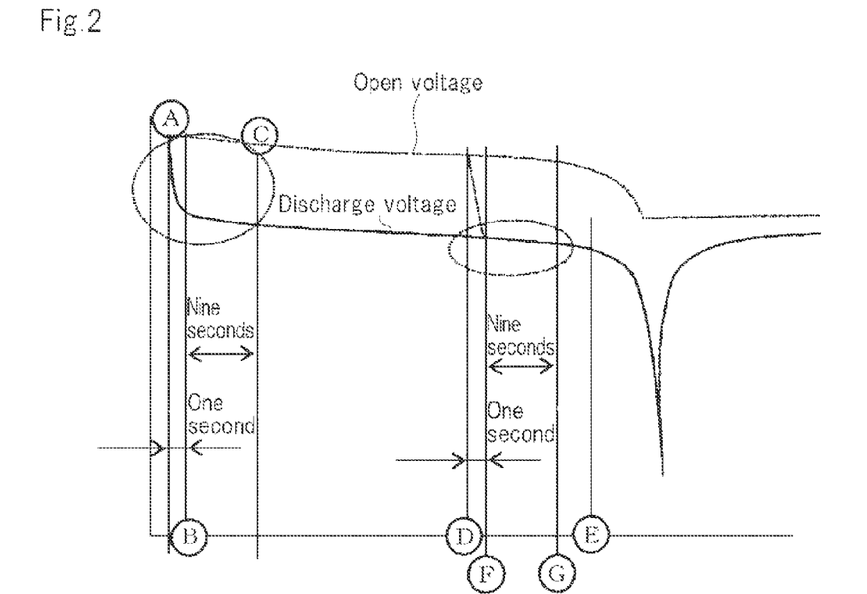
FIG. 2 is a flowchart showing a degradation measurement operation performed by control section 14 in secondary battery pack 10 according to the first exemplary embodiment.

FIG. 2 is a graph showing changes in voltage with discharge of the secondary cells. In FIG. 2, the voltage (discharge voltage) measured during discharge is indicated by the solid line, and the open voltage depending on the remaining capacity is indicated by the broken line. The value of the discharge voltage is generally lower than that of the open voltage because of the external impedance in the discharge path.

In the present exemplary embodiment, the remaining capacity is measured two times while secondary cells 13 are being discharged. Timing of measurement at two times is indicated by broken line ellipses on the graph shown in FIG. 2. The second measurement is performed at a point in time at which the integrated discharge capacity after the first measurement becomes equal to the discharge capacity reference value. The second measurement is performed while discharge is being continued. There are two cases of the first measurement: one in which the state of secondary cells 13 is changed from the open state to a discharge state at the time when the first measurement is performed (first measurement time); and one in which secondary cells 13 are already in a discharge state before the first measurement time.

(First Case)

The case in which the state of secondary cells 13 is changed from the open state to a discharge state at the first measurement time will first be described. The first measurement time is time point A.

Since the discharge voltage measured at time point A is equal to the open voltage at the first measurement time, the remaining capacity at the first measurement time can be obtained from the open voltage (the first open voltage).

Secondary cells 13 that have been in the open state enter a discharge state at time point A and the discharge voltage drops abruptly in a short time. As the discharge thereafter progresses gradually, the discharge voltage decreases gradually. During discharge, the open voltage cannot be directly measured. However, the open voltage decreases, as does the discharge voltage.

Control section 14 first measures the discharge voltage at time point A and measures the discharge voltage at intervals of one second from time point B, which corresponds to the end of a first designated time period from time point A, to time point C. The first designated time period is, for example, one second.

Control section 14 divides the discharge voltage at time point A (equal to the open voltage) by the discharge current measured by current sensing section 16. The result of this calculation is assumed to be time point A impedance, and the value of this impedance is assumed to be a ohms. The time point A impedance represents the sum of the internal impedance of secondary cells 13 and the external impedance outside secondary cells 13. This is because the abrupt voltage drop from the open state is determined by the external impedance present in the discharge path, and because the voltage after the abrupt voltage drop is determined by the internal impedance of secondary cells 13. It is preferable to select as the first designated time period a time period in which the time period during which the abrupt voltage drop is observed can be contained, and in which the change in internal impedance becomes sufficiently smaller than the external impedance. One second is a preferable example of such a time period.

Next, control section 14 measures the voltage across secondary cells 13 at intervals of one second from time point B to time point C corresponding to the end of a second designated time period therefrom, and divides the average of voltages by the discharge current measured by current sensing section 16. The result of this calculation is assumed to a BC-average impedance, and the value of this impedance is assumed to be b ohms. The second designated time period is, for example, nine seconds. This BC-average impedance represents the internal impedance of secondary cells 13. This is because the impedance that changes during discharge under such a condition that the current is constant is the internal impedance changing with the change in capacity due to a characteristic of secondary cells 13. It is preferable to select a time period as the second designated time period such that significant results of measurement of the internal impedance can be obtained with stability and the deviation of the BC-average impedance from the internal impedance at time point A is within a certain range. The internal impedance of secondary cells 13 can be calculated in this way.

Control section 14 may use the calculated internal impedance by correcting the calculated internal impedance to a value at a reference temperature based on a temperature characteristic of secondary cells 13.

Further, control section 14 calculates the external impedance by subtracting the BC-average impedance from the time point A impedance. The value of the external impedance is assumed to be c ohms. That is, c=a−b. The external impedance can be calculated in this way.

Discharge is continued without changing the conditions, and the discharge voltage is measured at time points D, F, and G in the vicinity of time point E, which is the second measurement time at which the integrated discharge capacity becomes equal to the discharge capacity reference value. By adding If the voltage drop corresponding to the external impedance to the discharge voltage at the second measurement time, the open voltage at the second measurement time can be calculated.

Calculation of the open voltage at the second measurement time will be described.

The discharge voltage at time point D in the vicinity of time point E (second measurement time) is divided by the discharge current measured by current sensing section 16. The result of this calculation is assumed to be impedance D(1), and the value of this impedance is assumed to be d(1) ohms.

As can be understood from FIG. 2, the values measured at the times before and in the vicinity of the second measurement time are used for calculation of the open voltage at the second measurement time. This is for the purpose of enabling the open voltage measurement to be normally completed even when discharge is ended immediately after the second measurement time. It is therefore necessary that control section 14 predicts the arrival of the second measurement time and performs processing before the arrival of the second measurement time.

Next, control section 14 measures the discharge voltage at intervals of one second from time point F to time point G corresponding to the end of the second designated time period (nine seconds) therefrom, and divides the average of voltages thereby measured by the discharge current measured by current sensing section 16. The result of this calculation is assumed to be average impedance D(9), and the value of this average impedance is assumed to be d(9) ohms.

Each of impedance D(1) and average impedance D(9) substantially represents the internal impedance. Therefore impedance D(1) or average impedance D(9) may be used as internal impedance, or the average of impedance D(1) and average impedance D(9) may be used. It is assumed here that the average of impedance D(1) and average impedance D(9) is used by way of example.

Control section 14 adds the external impedance held in advance to the average of impedance D(1) and average impedance D(9) (internal impedance) and multiplies the impedance as the result of this addition by the current value measured by current sensing section 16, thereby calculating the open voltage at time point D. This open voltage at time point D is a value approximate to the open voltage at time point E.

From the open voltage at time point E (the second open voltage), the remaining capacity at the second measurement time can be calculated.

(Second Case)

The case in which secondary cells 13 are already in a discharge state before the first measurement time will next be described.

Control section 14 is assumed to calculate and hold the external impedance in advance by the method used in the first case.

In the case where the cells have been in a discharge state from a time before the first measurement time, a transition of the discharge voltage similar to that in the vicinity of the second measurement time in the first case appears. That is, any abrupt change in voltage similar to that due to the transition from the open state to a discharge state in the vicinity of time point B shown in FIG. 2 does not occur.

In the second case, therefore, the open voltage at the first measurement time is also measured by the same method as the method of calculating the open voltage at the second measurement time in the first case. In this calculation, control section 14 uses the value of the external impedance held in advance.

For calculation of the open voltage at the second measurement time, however, values measured at times (time points D, F, and G in FIG. 2) before and in the vicinity of the second measurement time are used. However, values measured at times after and in the vicinity of the first measurement time may be used for calculation of the open voltage at the first measurement time.

The recovered capacity of secondary cells 13 can be calculated based on the first open voltage and the second open voltage calculated by the method described with respect to the first or second case and the discharge capacity reference value.

Figure 3:
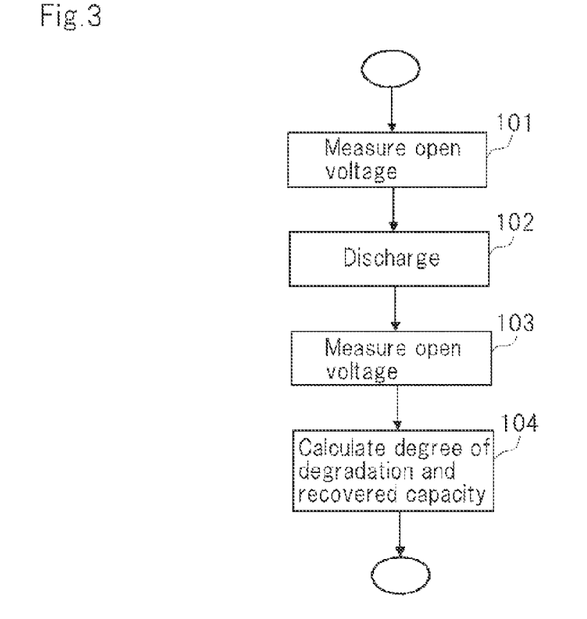
FIG. 3 is a flowchart showing a measurement operation of an open voltage performed by control section 14 in secondary battery pack 10 according to the first exemplary embodiment.

FIG. 3 is a flowchart showing a degradation measurement operation performed by control section 14 in secondary battery pack 10 according to the first exemplary embodiment.

Referring to FIG. 3, control section 14 performs the first open voltage measurement while secondary cells 13 are being discharged (step 101). If discharge of secondary cells 13 is started at this time, the external impedance is measured and updated at this time.

Subsequently, control section 14 discharges secondary cells 13 only to the discharge capacity reference value (step 102). Control section 14 then performs the second open voltage measurement while continuing discharge of secondary cells 13 (step 103).

Figure 4:
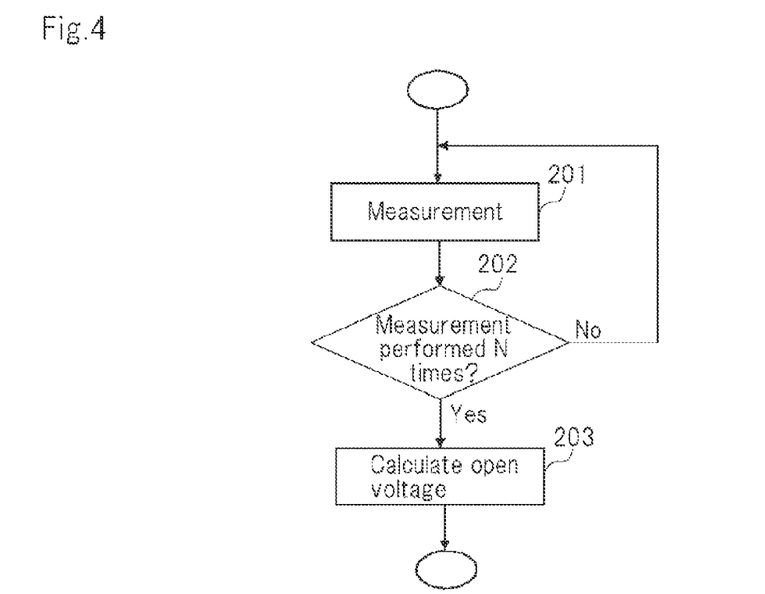
FIG. 4 is a flowchart showing a measurement operation of an open voltage performed by control section 14 in secondary battery pack 10 according to the first exemplary embodiment.

FIG. 4 is a flowchart showing the operation when control section 14 in secondary battery pack 10 according to the first exemplary embodiment measures the open voltage. This flow is common to the first and second open voltage measurements.

Control section 14 measures the discharge voltage at a plurality of time points as described above and calculates the internal impedance, the external impedance, the open voltage and the remaining capacity of secondary cells 13 based on the values obtained by the measurement. Accordingly, control section 14 repeats the voltage measurement a necessary number of times and thereafter proceeds to perform processing for calculating the open voltage and other values. In the example shown in FIG. 2, the necessary number of times is one time corresponding to A and nine times corresponding to B to C, i.e., a total of ten times, for the first open voltage measurement and is also ten times corresponding to D and F to G for the second open voltage measurement.

Referring to FIG. 4, control section 14 first measures the open voltage of secondary cells 13 by using battery sensing section 15 (step 201). Control section 14 then determines whether or not the number of times the measurement of the open voltage has been performed has reached the necessary number (step 202). If the number of times the measurement has been performed has not reached the necessary number, control section 14 returns to step 201 and again measures the open voltage.

When the number of times that the measurement has been performed reaches the necessary number, control section 14 calculates the open voltage from the measurement results (step 203).

After determining the open voltage, control section 104 returns to FIG. 3 and calculates the degree of degradation and the recovered capacity of secondary cells 13 from the open voltage measured by the first open voltage measurement in step 101, the open voltage measured by the second open voltage measurement in step 103, and the discharge capacity reference value (step 104).

As described above, in the present exemplary embodiment, the external impedance that is not changed by discharge is held in advance, and the open voltage is calculated by using the internal impedance calculated from the measured discharge voltage and the held external impedance. Therefore, degradation measurement can be performed with high accuracy while discharge is being continued.

Also, the temperature characteristic of the internal impedance of secondary cells 13 is compensated for. Degradation measurement can therefore be performed with further improved accuracy.

Since it is not necessary to perform discharge until the cells are fully discharged from the fully charged state, accurate degradation measurement can be performed in a short time and the time required for a periodical maintenance operation on the charge/discharge system using secondary battery pack 10 can be reduced or the maintenance operation can be omitted.

Since the recovered capacity and the degree of degradation of secondary battery pack 10 can be obtained with high accuracy, it is possible to present appropriate maintenance/inspection and interchange times.

Since degradation measurement can be performed with high accuracy without completely discharging secondary battery pack 10, it is possible to easily extract imbalance in a plurality of secondary battery packs 10 in a charge/discharge system in which secondary battery packs 10 are disposed in parallel with each other and in which secondary battery packs 10 are monitored by a host device.

Even in a charge/discharge system for standby use in which discharge is not performed under normal circumstances, and in which discharge of a portion is performed on rare occasions, degradation measurement can be performed on rare occasions for discharge.

(Concrete Example)

An example of calculation of the degree of degradation and a recovered capacity in the present exemplary embodiment will be described.

Figure 5:
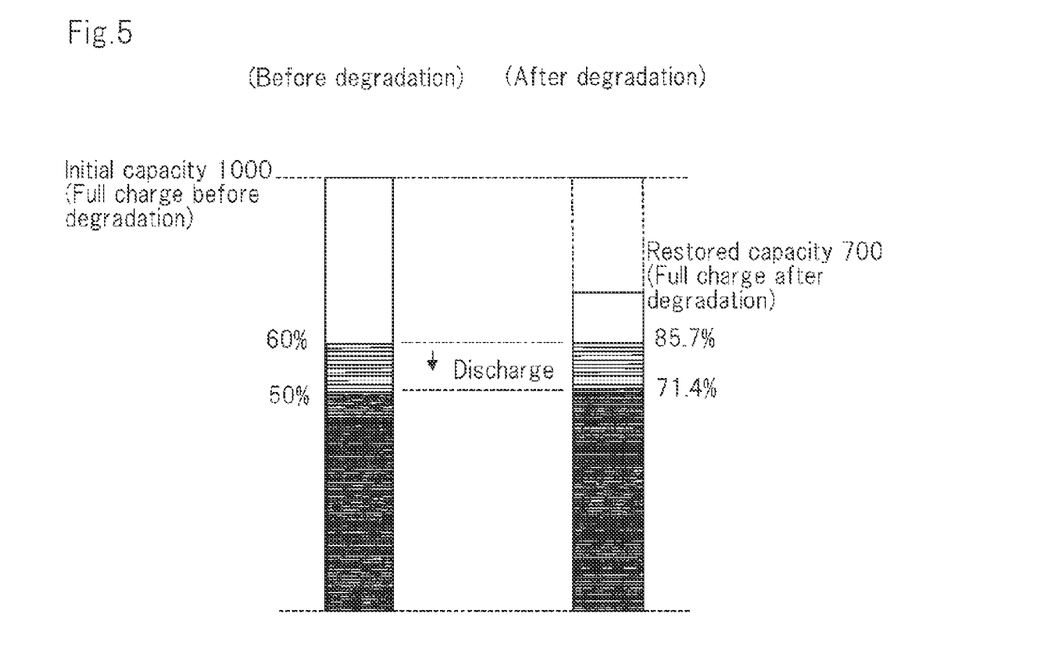
FIG. 5 is a diagram for explaining calculation of a degree of degradation and a recovered capacity.

FIG. 5 is a diagram for explaining calculation of the degree of degradation and the recovered capacity.

Referring to FIG. 5, it is assumed that a secondary battery having an initial capacity 1000 before degradation has degraded to a recovered capacity of 700 by being repeatedly charged and discharged. Degradation measurement is assumed here to be started from a certain charge state.

The remaining capacity is assumed to be 600 when degradation measurement is started (before discharge). The proportion of the remaining capacity of the secondary battery to the recovered capacity can be obtained from the open voltage. In the case where the remaining capacity is 600 when the recovered capacity is 700, the proportion of the remaining capacity to the recovered capacity is about 85.7%.

It is assumed here that the proportion (discharge rate reference value) of the reference value of the capacity on which discharge is performed (discharge capacity reference value) to the initial capacity of the secondary battery is 10%. If discharge by a capacity 100 corresponding to 10% of the initial capacity is performed from this state, the remaining capacity is 500. In the case where the remaining capacity is 500 when the recovered capacity is 700, the proportion of the remaining capacity to the recovered capacity is about 71.4%.

Accordingly, the difference (calculated discharge rate value) between the proportion of the remaining capacity to the recovered capacity of the secondary battery before discharge and the proportion of the remaining capacity to the recovered capacity of the secondary battery obtained from the open voltage after discharge is 14.3%. Also, the proportion of the discharge rate reference value (10%) to the calculated discharge rate value (14.3%) is about 70%. This is the degree of degradation. By multiplying the initial capacity by this degree of degradation, the recovered capacity 700 after degradation can be obtained.

In the first exemplary embodiment, a system has been assumed in which the external impedance as a load is constant or can be regarded as constant during degradation measurement. For example, if the time interval between the first measurement time and the second measurement time is short, the external impedance can be regarded as constant. By setting the discharge capacity reference value to a small value, the time interval between the first measurement time and the second measurement time can be made short. Also, if measurement is performed in a time period during which changes in the load are reduced, e.g., a time period in the night, measurement can be performed in a state where the external impedance can be regarded as constant. Also, operating the system so that the load is not changed during measurement enables measurement in a state where the external impedance is constant.

Second Exemplary Embodiment

In the first exemplary embodiment, a system has been assumed in which the external impedance as a load is constant or can be regarded as constant during degradation measurement. In many cases of actual systems, however, the load cannot be regarded as constant. For example, in a system provided in a residence, the load changes depending on the state of use of electrical appliances including the air conditioner. In a second exemplary embodiment, measurement of degradation of a secondary battery can be easily performed with high accuracy even in a system in which the load cannot be regarded as constant.

Figure 6:
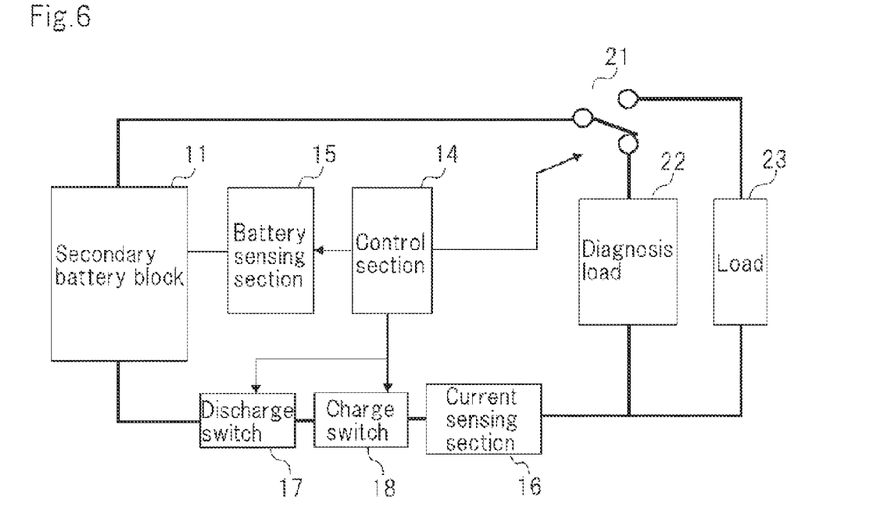
FIG. 6 is a block diagram showing a system configuration according to a second exemplary embodiment.

FIG. 6 is a block diagram showing a system configuration according the second exemplary embodiment. Secondary battery block 11, battery sensing section 15, current sensing section 16, discharge switch 17 and charge switch 18 in FIG. 6 are the same as those in the first exemplary embodiment shown in FIG. 1. Control section 14 shown in FIG. 6 corresponds to control section 14 in the first exemplary embodiment shown in FIG. 1.

In the present exemplary embodiment, secondary battery block 11 is connected to diagnosis switch 21 and is connected to one of load 23 and diagnosis load 22 by switching of diagnosis switch 21. Load 23 is an actual load to which electric power is supplied by the system, and the value of load 23 changes. Diagnosis load 22 is a load of a constant value used for measuring degradation of secondary battery block 11. Switching of diagnosis switch 21 is controlled by control section 14.

Figure 7A:
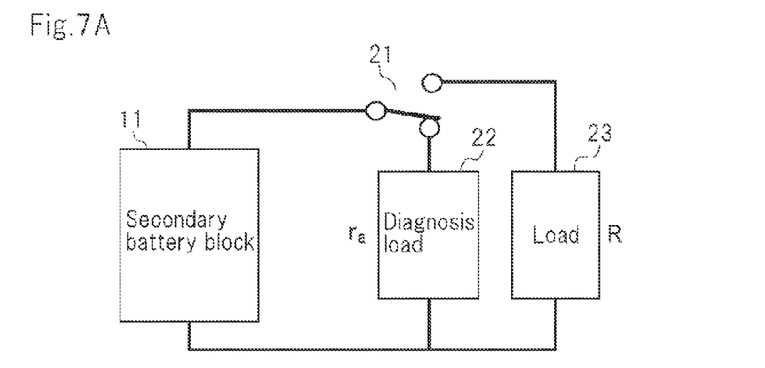
FIG. 7A is a diagram for explaining a sequence of operation for degradation diagnosis on secondary battery block 11.
Figure 7B:
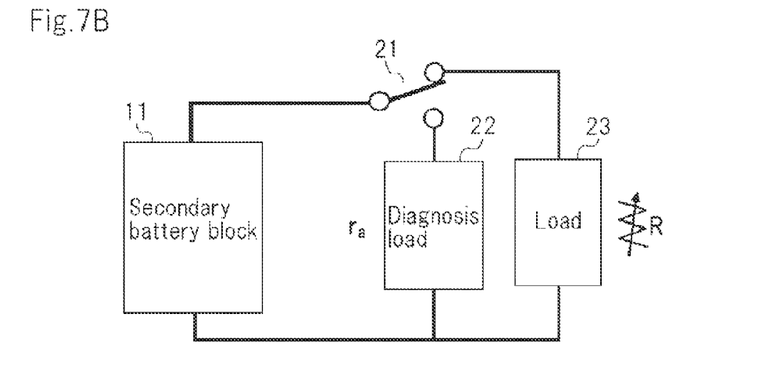
FIG. 7B is a diagram for explaining the sequence of operation for degradation diagnosis on secondary battery block 11.
Figure 7C:
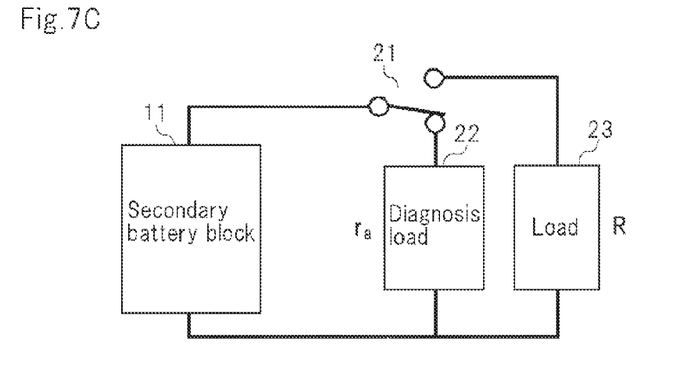
FIG. 7C is a diagram for explaining the sequence of operation for degradation diagnosis on secondary battery block 11.

Control section 14 performs basically the same operation as that in the first exemplary embodiment. However, when the voltage used for calculation of the internal impedance present in secondary cells 13 in secondary battery block 11 is measured with battery sensing section 15, control section 14 connects secondary battery block 11 to diagnosis load 22. More specifically, control section 14 connects secondary battery block 11 to diagnosis load 22 having a constant value ra in the first measurement timing (measurement timing indicated by the left broken line ellipse on the graph of FIG. 2), as shown in FIG. 7A. During the time period from the first measurement to the second measurement, control section 14 connects secondary battery block 11 to actual load 23 which changes in resistance value R, as shown in FIG. 7B, and discharges secondary battery block 11 by supplying electric power to actual load 23. In the second measurement timing (measurement timing indicated by the right broken line ellipse on the graph of FIG. 2), control section 14 again connects secondary battery block 11 to diagnosis load 22, as shown in FIG. 7C.

In the present exemplary embodiment, diagnosis load 22 whose value does not change is used in measurement of degradation of secondary battery block 11, thus enabling measurement of degradation of secondary battery block 11 to be easily performed with high accuracy even in the system in which load 23 changes.

In the first exemplary embodiment, control section 14 calculates the external impedance from the calculated internal impedance. In the second exemplary embodiment, the external impedance is constant-value diagnosis load 22 having an external impedance determined in advance and, therefore, it is not necessary for control section 14 to calculate the external impedance.

In the present exemplary embodiment, a plurality of secondary battery blocks 11 may be disposed in parallel with each other and electric power may be supplied from a terminal connected in common to secondary battery blocks 11 to load 23.

Figure 8:
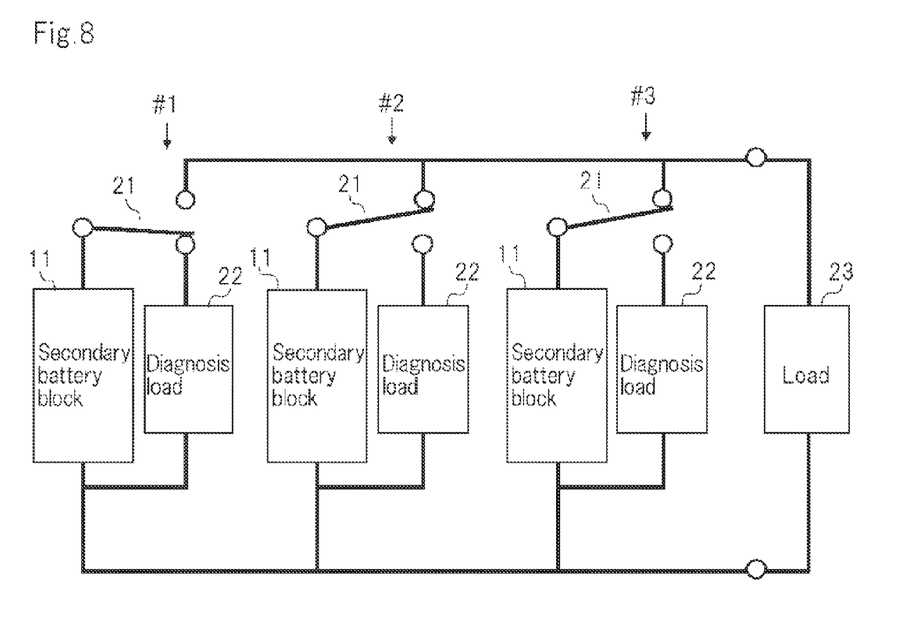
FIG. 8 is a block diagram showing a first example of a configuration of a system in which a plurality of secondary battery blocks 11 are disposed in parallel with each other in the second exemplary embodiment.

FIG. 8 is a block diagram showing the first example of a configuration of a system in which a plurality of secondary battery blocks 11 are disposed in parallel with each other in the second exemplary embodiment. In the first example of the configuration, secondary battery blocks 11 exist in three lines #1 to #3, and these three secondary battery blocks 11 are connected in parallel with each other.

One diagnosis load 22 is provided on each of three secondary battery blocks 11.

Three control sections 14 may exist in correspondence with three secondary battery blocks 11 or one common control section 14 may exist for three secondary battery blocks 11. Control section 14 makes a degradation diagnosis on one of the plurality of secondary battery blocks 11 and connects secondary battery block 11 to be degradation-diagnosed to corresponding diagnosis load 22 by controlling diagnosis switch 21 at the time of measuring with battery sensing section 15 the voltage used for calculation of the internal impedance of secondary battery block 11 to be degradation-diagnosed. Also, control section 14 maintains secondary battery blocks 11 other than the one to be degradation-diagnosed in the state of being connected to actual load 23 at all times. In the example shown in FIG. 8, secondary battery block 11 in line #1 is to be degradation-diagnosed.

Figure 9:
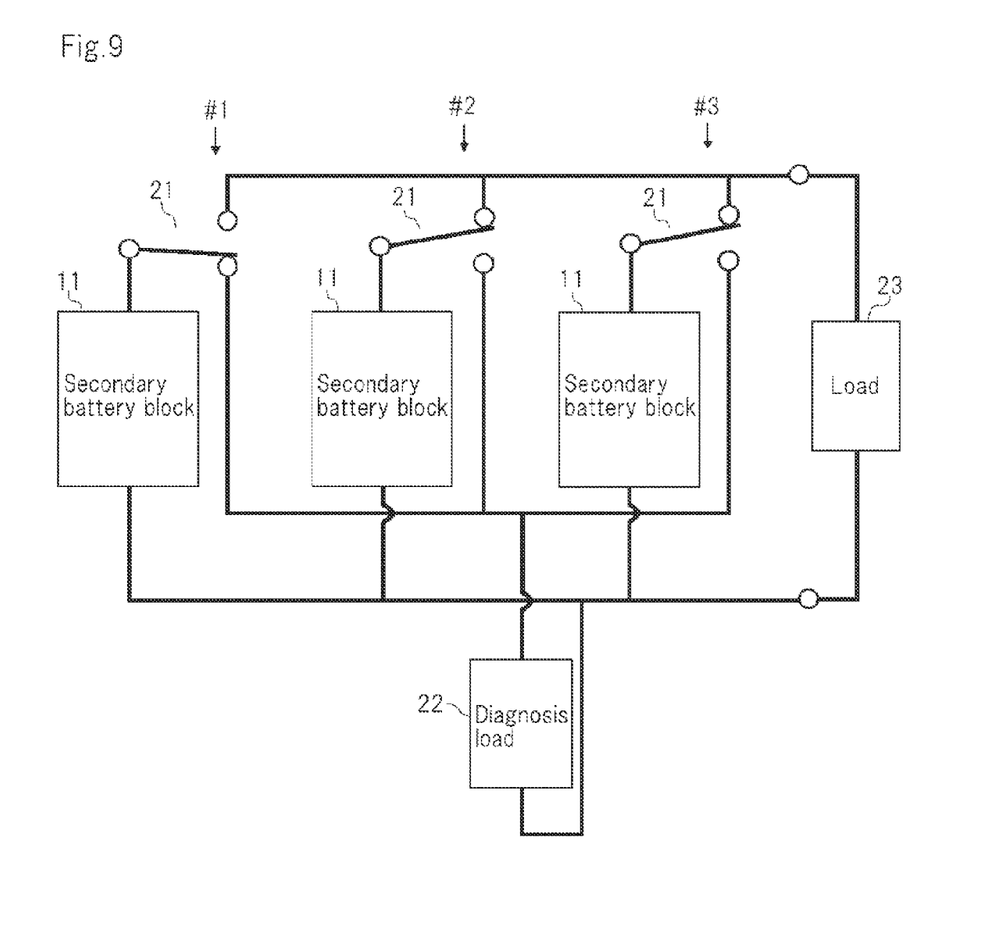
FIG. 9 is a block diagram showing a second example of the configuration of the system in which a plurality of secondary battery blocks 11 are disposed in parallel with each other in the second exemplary embodiment.

FIG. 9 is a block diagram showing a second example of the configuration of the system in which a plurality of secondary battery blocks 11 are disposed in parallel with each other in the second exemplary embodiment. Also in the second example of the configuration, secondary battery blocks 11 exist in three lines #1 to #3, and these three secondary battery blocks 11 are connected in parallel with each other.

However, one common diagnosis load 22 is provided for three secondary battery blocks 11.

Three control sections 14 may exist in correspondence with three secondary battery blocks 11 or one common control section 14 may exist for three secondary battery blocks 11. Control section 14 makes a degradation diagnosis on one of three secondary battery blocks 11 and connects secondary battery block 11 to be degradation-diagnosed to common diagnosis load 22 at the time of measuring with battery sensing section 15 the voltage used for calculation of the internal impedance of secondary battery block 11 to be degradation-diagnosed. Also, control section 14 maintains secondary battery blocks 11 other than the one to be degradation-diagnosed in the state of being connected to actual load 23 at all times. In the example shown in FIG. 9, secondary battery block 11 in line #1 is to be degradation-diagnosed.

In each of the above-described exemplary embodiments, the operation of control section 14 can also be realized by making a computer execute a software program recorded on a recording medium.

The invention of the present application has been described with reference to the exemplary embodiments. The invention of the present application, however, is not limited to the above-described exemplary embodiments. Various changes and modifications that those skilled in the art can understand can be made in the configuration and details of the invention of the present application within the scope of the invention of the present application.

The invention claimed is:

1. A degradation measurement device comprising:
a battery sensing section that measures a voltage across a secondary battery;
a current sensing section that measures a current flowing through said secondary battery; and
a control section that holds in advance the value of an external impedance present in a discharge path outside said secondary battery, discharges said secondary battery from a first measurement time to a second measurement time at which an integrated discharge capacity based on a discharge current measured by said current sensing section becomes equal to a predetermined discharge capacity reference value, calculates an internal impedance present in said secondary battery at said second measurement time based on the voltage measured by said battery sensing section, calculates a second open voltage at said second measurement time by multiplying the sum of said external impedance and said internal impedance by the discharge current measured by said current sensing section, and calculates a recovered capacity of said secondary battery based on a first open voltage at said first measurement time, said second open voltage and said discharge capacity reference value.

2. The degradation measurement device according to claim 1, wherein if said secondary battery has been in a discharge state from a time before said first measurement time, said control section calculates said first open voltage at said first measurement time by calculating said internal impedance present in said secondary battery based on the voltage measured by said battery sensing section, and by multiplying the sum of said external impedance and said internal impedance by the discharge current measured by said current sensing section, and wherein if a transition from an open state to a discharge state is made at said first measurement time, said control section calculates said internal impedance and said external impedance of said secondary battery at said first measurement time based on a drop in voltage across said secondary battery due to discharge in a first designated time period and the voltage thereafter measured by said battery sensing section, holds said external impedance, and sets the voltage across said secondary battery at said first measurement time as said first open voltage.

3. The degradation measurement device according to claim 2, wherein when a transition from an open state to a discharge state is made at said first measurement time, said control section calculates the sum of said internal impedance and said external impedance by dividing the voltage across said secondary battery at said first measurement time by the discharge current measured by said current sensing section, calculates said internal impedance by dividing the average value of a plurality of voltages measured by said battery sensing section after a lapse of said first designated time period by the discharge current, and calculates said external impedance by subtracting said internal impedance from the above sum.

4. The degradation measurement device according to claim 2, wherein said first designated time period is one second.

5. The degradation measurement device according to claim 2, wherein said control section updates said held external impedance each time the state of said secondary battery is changed from the open state to the discharge state.

6. The degradation measurement device according to claim 1, wherein said external impedance is a diagnosis load of a constant value, and said control section connects said secondary battery to said diagnosis load when the voltage used for calculation of said internal impedance is measured by said battery sensing section.

7. The degradation measurement device according to claim 6, wherein a plurality of said secondary batteries to be connected in parallel with each other exist; said diagnosis load is provided in common for said plurality of secondary batteries; and said control section makes a degradation diagnosis on any one of said plurality of secondary batteries, and connects said secondary battery to said diagnosis load when the voltage used for calculation of said internal impedance of said secondary battery to be degradation-diagnosed is measured by said battery sensing section.

8. The degradation measurement device according to claim 1, wherein said control section calculates as a calculated discharge rate value a difference between a proportion of a remaining capacity of said secondary battery obtained from said first open voltage to said recovered capacity and a proportion of a remaining capacity of said secondary battery obtained from said second open voltage to said recovered capacity, and calculates as a degree of degradation a proportion of a discharge rate reference value to the calculated discharge rate value, which is a proportion of the discharge capacity reference value to an initial capacity of said secondary battery.

9. The degradation measurement device according to claim 8, wherein said control section calculates said recovered capacity by multiplying the initial capacity by the degree of degradation.

10. The degradation measurement device according to claim 1, wherein said control section corrects said internal impedance to a value at a reference temperature based on a temperature characteristic of said secondary battery.

11. A secondary battery pack comprising:
a secondary battery capable of being charged and discharged;
a battery sensing section that measures a voltage across said secondary battery;
a current sensing section that measures a current flowing through said secondary battery; and
a control section that holds in advance the value of an external impedance present in a discharge path outside said secondary battery, discharges said secondary battery from a first measurement time to a second measurement time at which an integrated discharge capacity based on a discharge current measured by said current sensing section becomes equal to a predetermined discharge capacity reference value, calculates an internal impedance present in said secondary battery at said second measurement time based on the voltage measured by said battery sensing section, calculates a second open voltage at said second measurement time by multiplying the sum of said external impedance and said internal impedance by the discharge current measured by said current sensing section, and calculates a recovered capacity of said secondary battery based on a first open voltage at said first measurement time, said second open voltage and said discharge capacity reference value.

12. A degradation measurement method comprising:
holding in advance the value of an external impedance present in a discharge path outside a secondary battery;
discharging said secondary battery from a first measurement time to a second measurement time at which an integrated discharge capacity based on a measured discharge current becomes equal to a predetermined discharge capacity reference value;
calculating an internal impedance present in said secondary battery at said second measurement time based on a voltage measured by said battery sensing section, and calculating a second open voltage at said second measurement time by multiplying the sum of said external impedance and said internal impedance by the measured discharge current; and
calculating a recovered capacity of said secondary battery based on a first open voltage at said first measurement time, said second open voltage and said discharge capacity reference value.

13. A computer-readable recording medium having recorded therein a program for causing a computer to execute the steps of:
holding in advance the value of an external impedance present in a discharge path outside a secondary battery;
discharging said secondary battery from a first measurement time to a second measurement time at which an integrated discharge capacity based on a measured discharge current becomes equal to a predetermined discharge capacity reference value;
calculating an internal impedance present in said secondary battery at said second measurement time based on a voltage measured by said battery sensing section, and calculating a second open voltage at said second measurement time by multiplying the sum of said external impedance and said internal impedance by the measured discharge current; and
calculating a recovered capacity of said secondary battery based on a first open voltage at said first measurement time, said second open voltage and said discharge capacity reference value.

* * * * *